(12) United States Patent
Wang et al.

(10) Patent No.: US 6,652,712 B2
(45) Date of Patent: Nov. 25, 2003

(54) INDUCTIVE ANTENNA FOR A PLASMA REACTOR PRODUCING REDUCED FLUORINE DISSOCIATION

(75) Inventors: Shiang-Bau Wang, Hsinchu (TW); Daniel J. Hoffman, Saratoga, CA (US); Chunshi Cui, San Jose, CA (US); Yan Ye, Saratoga, CA (US); Gerardo Delgadino, Santa Clara, CA (US); David McParland, Austin, TX (US); Matthew L. Miller, Newark, CA (US); Douglas A. Buchberger, Jr., Livermore, CA (US); Steven C. Shannon, San Mateo, CA (US)

(73) Assignee: Applied Materials, Inc, Santa Clara, CA (US)

( * ) Notice: Subject to any disclaimer, the term of this patent is extended or adjusted under 35 U.S.C. 154(b) by 0 days.

(21) Appl. No.: 10/028,646

(22) Filed: Dec. 19, 2001

(65) Prior Publication Data

US 2003/0111181 A1 Jun. 19, 2003

(51) Int. Cl.[7] .............................. C23C 16/00; C23F 1/00
(52) U.S. Cl. ................................. 156/345.48; 118/723 I
(58) Field of Search ........................ 118/723 I, 723 IR, 118/723 AN; 156/345.48, 345.49; 315/111.51; 204/298.06, 298.34

(56) References Cited

U.S. PATENT DOCUMENTS 6,447,635 B1 * 9/2002 Ra ......................... 156/345.48

OTHER PUBLICATIONS

U.S. patent application Ser. No. 09/039,216, filed Mar. 14, 1998 entitled, "Distributed Inductively–Coupled Plasma Source," by Brian Pu, et al.

Shindo, Haruo, et al., "Electron energy control in an inductively coupled plasma at low pressures," *Applied Physics Letters*, vol. 76, No. 10, Mar. 6, 2000, pp. 1246–1248.

* cited by examiner

*Primary Examiner*—Luz L. Alejandro
(74) *Attorney, Agent, or Firm*—Robert M. Wallace; Joseph Bach

(57) ABSTRACT

An inductive antenna of a plasma reactor for processing a semiconductor wafer is connected to a radio frequency (RF) power source, and consists of a conductor arranged in successive loops that wind in opposing directions, adjacent pairs of the successive loops having facing portions in which current flow is parallel, the facing portions being sufficiently close to at least nearly share a common current path, whereby to form transitions across the facing portions between opposing magnetic polarizations.

12 Claims, 6 Drawing Sheets

US 6,652,712 B2

INDUCTIVE ANTENNA FOR A PLASMA REACTOR PRODUCING REDUCED FLUORINE DISSOCIATION

BACKGROUND OF THE INVENTION

Plasma reactors used in etch processing of semiconductor wafers in the manufacture of microelectronic integrated circuits tend to be limited by at least one of two factors: (a) etch selectivity and (b) etch rate. Capacitively coupled plasma reactors tend to exhibit superior etch selectivity but with only limited etch rate, while inductively coupled plasma reactors tends 2-D to exhibit superior etch rate but inferior etch selectivity. As semiconductor device geometries become increasingly smaller in the constant quest for higher on-chip clock speeds, these limitations become more critical. With smaller device geometries, the etching of contacts openings, for example, through multiple thin film layers, involves higher aspect ratios (deeper holes with smaller diameters).

Etch processes typically employ a fluorocarbon gas that dissociates into various species in the plasma. Dissociation of process gas molecules occurs because the RF power applicator (e.g., a capacitively coupled electrode pair or an inductively coupled coil antenna) produces "hot" electrons in the plasma with kinetic energies sufficient to dissociate various molecular species into simpler species upon collision. The energy of the "hot" electrons produced by the RF power applied to the plasma is distributed over some range, and different electron energies tend to produce different dissociated process gas species. Some species are polymer precursors that form an etch-resistant polymer coating on the non-oxygen-containing thin film surface. This feature improves etch selectivity when etching oxygen-containing materials such as silicon dioxide. Other species are etchants consisting of various fluoro-carbon species. The more volatile etchants are the more simpler chemical species, the most simple (free fluorine) being the most volatile etchant and the least selective. Greater dissociation produces simpler and more volatile etchant species and therefore leads to less etch selectivity. A process with less dissociation provides more complex etch species and therefore greater etch selectivity. Selectivity is also enhanced by the presence of more polymer precursor species. However, as the plasma becomes more polymer-rich, it is more prone to permit accumulation of polymer near the bottom of narrow deep openings, leading to etch stopping.

The smaller device geometries are more prone to etch stopping, in which the etch process stops before the hole has been etched to the required depth. In order to avoid such a problem, the process can be performed at higher plasma density (by increasing the plasma source power), but such changes can lead to greater dissociation within the plasma and a consequent loss of etch selectivity. Without increasing plasma density, the etch rate can be unacceptably low and etch stopping can occur.

As a result, the process window in which an acceptable balance between etch rate, etch selectivity and etch stopping can be realized is becoming smaller, particularly as semiconductor device geometries shrink. Currently, it is felt that a capacitively coupled reactor provides a better way around such problems because its superior etch selectivity permits the etch process to be carried out to completion with less damage to photoresist films and device structures, in comparison with an inductively coupled reactor. However, a capacitively coupled reactor typically cannot attain the higher etch rate of an inductively coupled reactor.

An inductively coupled reactor is disclosed, for example, in U.S. patent application Ser. No. 09/039,216 filed Mar. 14, 1998 by Brian Pu, et al. entitled, "Distributed Inductively-Coupled Plasma Source" and assigned to the present assignee. In the referenced application, the inductive antenna consists of a number of widely separated RF-driven coils in which successive coils have opposite polarity. The purpose of the opposing polarity coils is to reduce eddy currents formed in a conductive ceiling below the coil antenna so that RF power may be inductively coupled through the ceiling.

Accordingly there has seemed to be no solution to the problem of limited etch selectivity and limited etch rate. It would be highly advantageous if a plasma reactor could be provided having the etch rate of an inductively coupled reactor together with the etch selectivity of a capacitively coupled reactor.

SUMMARY OF THE DISCLOSURE

A plasma reactor for processing a semiconductor workpiece, the reactor includes a vacuum chamber with a sidewall and a ceiling enclosing the vacuum chamber, a workpiece support pedestal within the vacuum chamber, a process gas inlet to the vacuum chamber and a vacuum pump coupled to the vacuum chamber, and an inductive antenna adjacent the vacuum chamber and an RF power source coupled to the inductive antenna. The inductive antenna includes an array of plural current conducting loops placed side-by-side and defining a surface, successive ones of the plural current conducting loops being wound so as to carry current from the RF source in opposite directions. The current conducting loops are respective conductors, at least a portion of each conductor of one loop being adjacent at least a portion of the conductor of the next loop of the array, the portions carrying current in the same direction and being sufficiently close so as to define a juncture sharing a common current path, the array having plural such junctures periodically spaced along at least one length thereof.

The spacing between the junctures corresponds to a distance traveled by an electron of a selected kinetic energy during one half cycle of the RF power source. Preferably, the selected kinetic energy is below the fluorine ionization energy band whereby excitation of electrons populates energy levels outside of the Ins fluorine ionization energy band. Alternatively, the selected kinetic energy is within the fluorine ionization energy band whereby electrons within the fluorine ionization energy band are excited to a higher energy level outside of the fluorine ionization energy band.

Preferably, the junctures are spaced uniformly. The shorter spacing of the junctures is along an inner circular path at an inner radius and a longer spacing of the junctures is along an outer circular path at an outer radius. The shorter and longer spacings correspond to distances traveled by electrons of respective higher and lower selected kinetic energies during one half cycle of the RF power source.

DETAILED DESCRIPTION

Figure 1:
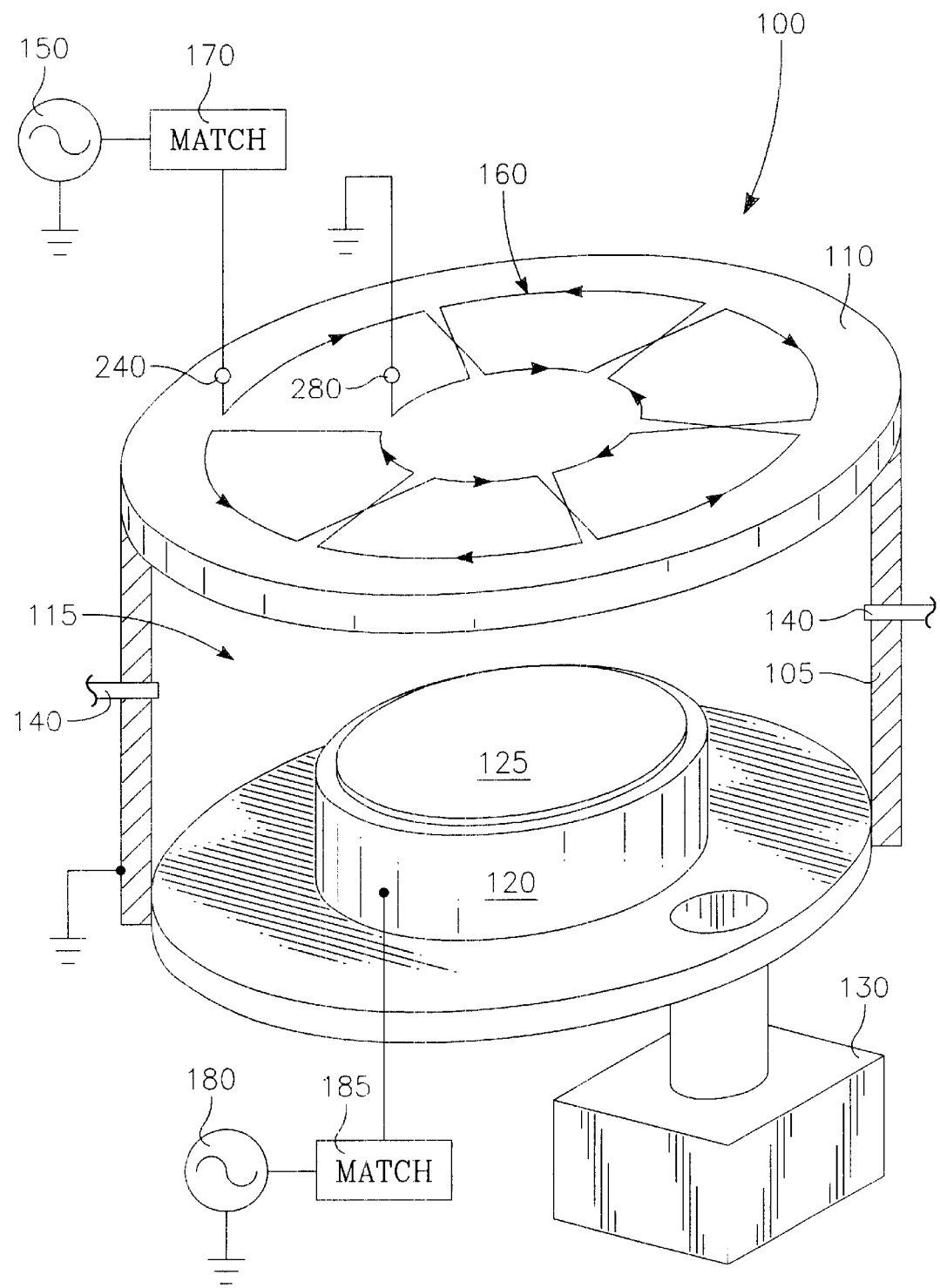
FIG. 1 is a partially cut-away perspective view of an embodiment of the invention.

In accordance with the present invention, a plasma reactor coil antenna is constructed so that it accelerates electrons of certain selected kinetic energy levels, while ignoring electrons in other kinetic energy levels. In addition, the selected energy levels are arranged with respect to the ionization energy band of fluorine so as to avoid populating the fluorine ionization energy band while populating other energy bands. Thus, RF power is inductively coupled to the plasma for maximum ion density while minimizing fluorine dissociation. This minimization of fluorine dissociation significantly improves etch selectivity without limiting plasma ion density, a result heretofore unattained in the art. This improvement rests upon the confinement of fluorine dissociation within a relatively narrow kinetic energy band between minimum of about 2 electron Volts (eV) and maximum of about 6 eV in a typical fluorocarbon and/or fluorohydrocarbon process gas. In one embodiment, the plasma reactor coil antenna is constructed so that it accelerates electrons below 2 eV to kinetic energies above 6 eV. In another embodiment, it may, in addition, accelerate electrons within the 2–6 eV band to kinetic energies above 6 eV. In the first case, the coil antenna avoids adding any electrons into the fluorine dissocation energy band, while in the second case it actually removes them from this band. In either case, the population of electrons within the fluorine energy band is minimized, with the result that fluorine dissocation is minimized and therefore etch selectivity is greatly increased. One significant advantage is that these favorable results are achieved while permitting maximum RF power to be inductively coupled to the plasma, so that maximum etch rate is achieve while etch selectivity is also maximized.

The construction of the plasma reactor coil antenna that thus discriminates against the fluorine ionization energy band involves the reversal of the inductive field polarity both temporally (at the frequency of the RF source) and spatially at periodic locations. The spatial reversal of the inductive field is achieved by merging adjacent windings of neighboring (and oppositely wound) loops at the periodic locations or junctures. For such oppositely wound loops that are next to one another, the portion of their windings that are closest to one another have current running in the same direction, even though the two loops are oppositely wound. These adjacent portions can therefore be closely spaced so that the two currents appear to merge almost into a single path, thus defining a very narrow boundary or juncture between the opposing fields of the neighboring loops. The size of the individual loops defines the spacing between these periodic junctures and is preferably uniform. This distance is selected to correspond to the distance traveled in the plasma by an electron having a selected kinetic energy. Thus, a series of adjacent windings of the coil antenna have opposing (alternating) polarities, and appear to at least nearly merge at the junctures between neighboring windings. An electron in the plasma travelling along the path between two such junctures is accelerated while traveling along one winding and, if the RF inductive field reverses at about the time the electron arrives at the juncture with the next winding, the electron will continue to be accelerated. But, this only happens if the velocity (kinetic energy) of that electron is such that its arrival at the next juncture occurs when the RF field reaches its zero-crossover point. This kinetic energy E may be at least qualitatively evaluated as the velocity ($[2E/m]^{1/2}$) whose product with the half-cycle time T/2 of the RF power source is equal or approximately equal to the spacing S between adjacent windings of the coil antenna. Thus, the energy levels of the electrons to be accelerated are selected by selecting the spacing between the junctures of adjoining windings of opposing polarities.

Figure 2:
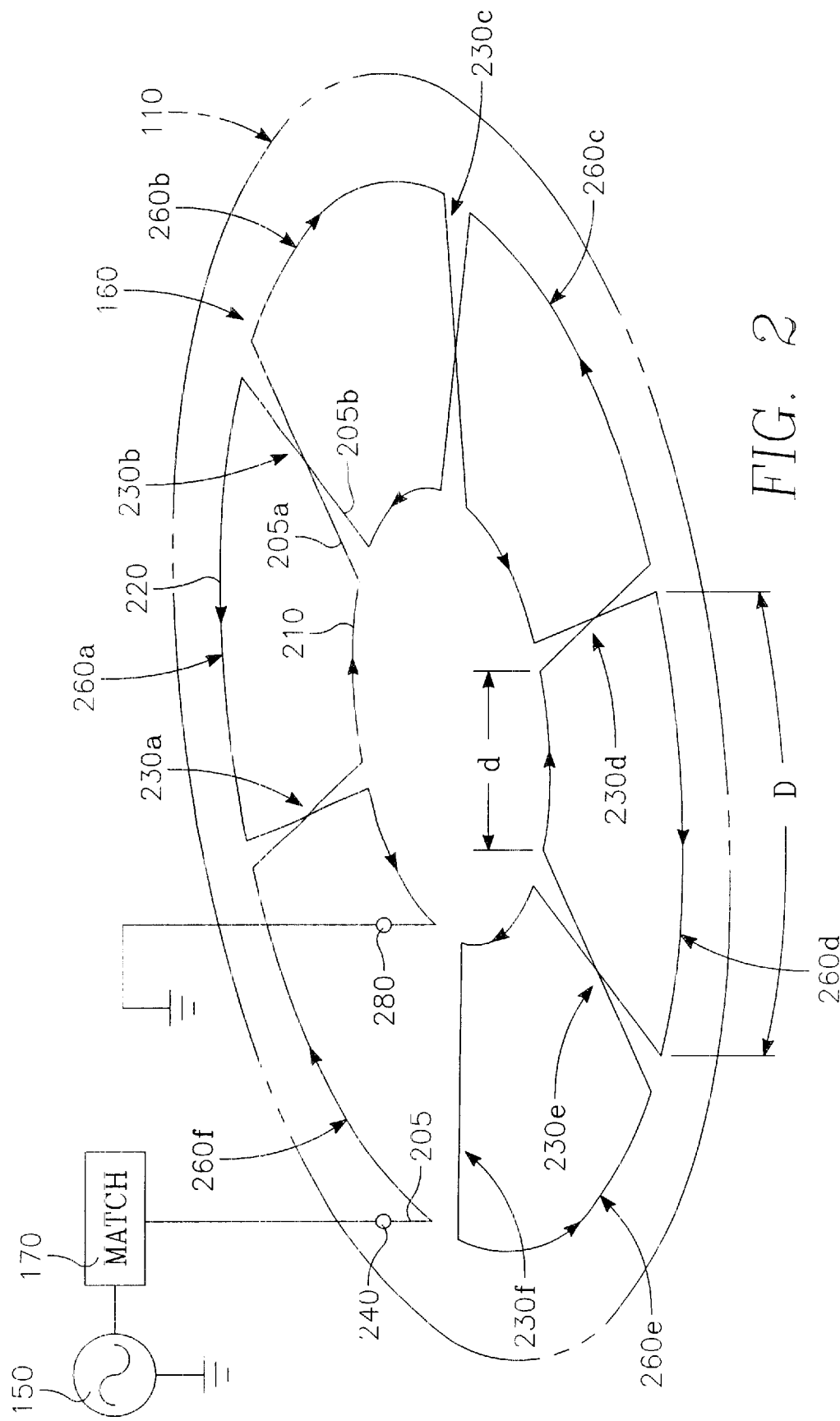
FIG. 2 is a top perspective view of an antenna corresponding to FIG. 1.

Referring to FIGS. 1 and 2, a first embodiment of the invention is a plasma 100 reactor having a side wall 105 and a ceiling 110 enclosing a vacuum chamber 115 containing a wafer A support pedestal 120 for supporting a semiconductor wafer 125 to be processed. A vacuum pump 130 maintains a desired pressure within the vacuum chamber 115. Plasma process gas, such as a fluorocarbon gas, is introduced through gas injection nozzles 140. A plasma is maintained within the chamber by applying RF power from an RF power generator 150 across an inductive antenna 160 through an RF impedance match circuit 170. The inductive antenna 160 overlies the ceiling 110. In addition, ion energy at the wafer surface may be controlled separately by connecting a second RF power generator 180 through another RF impedance match circuit 185 to the wafer support pedestal 120. If the side wall 105 is conductive, it may be grounded so as to serve as a return electrode for the RF bias power applied at the wafer support pedestal 120 by the second RF power generator 180.

The inductive coil antenna 160 of FIG. 1 is shown in detail in FIG. 2 and consists of a single conductor 205 wound in consecutive "figure-eight" loops which are squared and arranged circularly. There are two circular paths, an inner circular path 210 and an outer circular path 220 and plural radial paths 230a–f. Half the length of the conductor 205 starts at the connection terminal 240 (with the RF power generator 150), and extends clock-wise, alternating between the inner and outer circular paths 210, 220 by passing through the radial paths 230a–f. In alternate ones of the radial paths 230a,c,e, the clock-wise extending half of the conductor 205 extends inwardly and in the remaining ones of the radial paths 230b,d,f, the clock-wise extending half of the conductor 205 extends outwardly (as indicated by the arrows). The clock-wise extending half of the conductor 205 terminates at the radial path 230f, where the conductor reverses direction so that its second half extends counter-clockwise from the radial path 230f. In alternate ones of the radial paths 230e,c,a, the counter-clockwise extending half of the conductor 205 extends inwardly and in the remaining ones of the radial paths 230d,b, the clock-wise extending half of the conductor 205 extends outwardly (as indicated by the arrows). The counter-clockwise extending half of the conductor 205 terminates at the return terminal 280. The result is a series of loops 260a–e arranged circularly in which current flow is counter-clockwise in alternate loops 260a, 260c, 260e and is clockwise in the remaining loops 260b, 260d, 260f. The magnetic fields of neighboring loops 260a–260f are of opposite polarity.

The radial paths 230a–f are shared by the clockwise-extending and counter-clockwise extending conductor halves running between the inner and outer circular paths 210, 220. Thus, the radial paths 230a–f are the junctures between adjacent opposing windings or loops 260a–f. Current flow in the two conductors sharing each radial path 230a–f is in the same direction. In alternate radial paths 230a, 230c, 230e the current flow is radially inward in the instantaneous RF cycle illustrated, while in the remaining radial paths 230b, 230d, 230f the current flow is radially outward. This is true during alternate half cycles of the RF power source, while the opposite obtains during the remaining half cycles.

In the embodiment of FIG. 2, it is within each of the radial paths 230a–f that the currents of two adjacent loops 260a–f appear to merge in a single current path (although, in this example, their conductors do not touch). For example, the radial path 230b is shared by the conductors 205a, 205b of the adjacent loops 260a, 260b. The portion of the conductors 205a, 205b lying within the radial path 230b are sufficiently close to provide a fairly pure transition between the opposing magnetic fields of the two loops 260a, 260b for an electron traveling across the juncture between the two loops 260a, 260b, so that there is little or no intervening magnetic field or lack of one within that juncture. Otherwise, if the portions of the conductors 205a, 205b lying within the radial path 230b were not sufficiently closely spaced so as to form a significant gap between them, the juncture would not present as sharp a transition between the opposing fields of the two loops 260a, 260b. In such a case, even if the electron arrived at this juncture precisely at the time of an applied RF power zero crossing, it would not instantly experience the full accelerating force of the constructive transition of the field reversal that it otherwise would were the two conductors closer together within the radial path 230b.

Referring to FIG. 2, the distance D along the outer circular path 220 between junctures or radial paths 230e and d (for example) defines a first spacing in which electrons of a particular kinetic energy, E(D) will constantly be accelerated. This energy satisfies, approximately, the following relation:

$$E(D)=2m_e D^2/T^2$$

Similarly, the distance d along the inner circular path 210 between radial paths 230d and e (for example) defines a second spacing d in which electrons of a particular kinetic energy E(d) will constantly be accelerated. This latter particular energy satisfies, approximately, the following relation:

$$E(d)=2m_e d^2/T^2$$

Thus, the inductive antenna of FIG. 2 will accelerate electrons in two different energy bands centered, respectively, at E(D) and E(d) to higher energy bands. The two energy bands are selected by selecting the respective lengths D and d. How to select these lengths may be understood by reference to the electron energy distribution function (EEDF) illustrated in FIG. 3. The vertical axis of FIG. 3 corresponds to the electron population (P) density while the horizontal axis corresponds to electron energy in eV. The EEDF curve obtained in a conventional reactor has a peak falling near or within the fluorine ionization energy band between 2 eV and 6 eV and long tail that extends beyond 12 eV. The curve labeled "FIG. 1 reactor" is obtained using the multi-opposed loop inductive antenna of FIGS. 1 and 2 in which at least one of the lengths D, d is selected to correspond to an energy level at or below 2 eV. The effect of such a selection is to accelerate a significant portion of the electrons below or at the bottom of the fluorine dissociation energy band to another energy level well-above the fluorine dissociation energy band of 2–6 eV. The result is a net reduction of the population of electrons within the fluorine dissociation energy band (corresponding to the dip in the middle of the curve), and two new peaks below and above this band. The curve labeled "FIG. 1 reactor" is therefore bi-modal. RF power is coupled to the plasma to produce high plasma ion density characteristic of an inductively coupled source as in the conventional reactor, because the areas under the two curves are about the same. Thus, the reactor of FIG. 1 enjoys superior etch selectivity. However, the fluorine dissociation is much less due to the relative lack of electrons within the 2–6 eV fluorine dissociation band, corresponding to the dip in the bi-modal curve, so that etch selectivity is relatively high in the reactor of FIG. 1.

Figure 3:
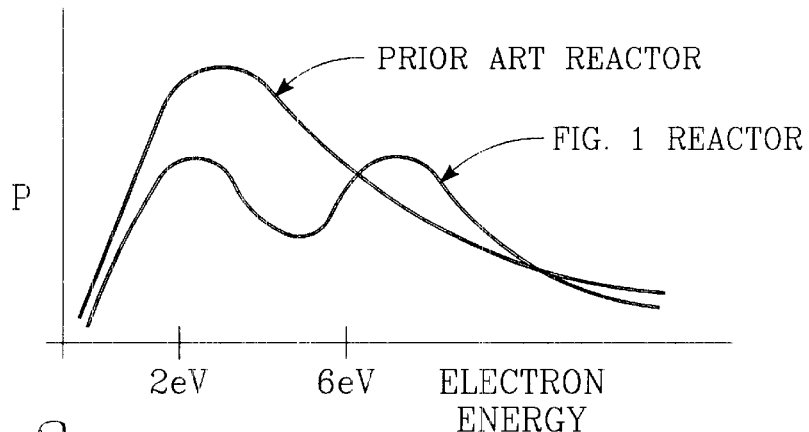
FIG. 3 is a graph of electron energy distribution functions exhibited by a conventional reactor and by the embodiment of FIG. 1, respectively.

In one embodiment, the shorter loop spacing length d may be selected appropriately to create the lower energy peak of FIG. 3 while the longer loop spacing length D may be selected appropriately to create the higher energy peak of FIG. 3. Thus, d may correspond to an electron energy E(d) well below 2 eV, while D may correspond to an electron energy E(D) near 2 eV or even within the dissociation energy band of 2–6 eV. In another implementation, both E(d) and E(D) may lie within the fluorine dissociation range of 2–6 eV so as to take electrons lying within that energy band and accelerate them out of it to energy levels well-above 6 eV. In either case, the electron population between 2 eV and 6 eV is transferred, generally, to energies above 6 eV so as to decrease fluorine dissocation and thereby improve etch selectivity. Thus, it is seen that both d and D should be on the order of $(2E/m)^{1/2}(T/2)$ where E is between about 0.5 and 7 eV, m is the electron mass and T is one cycle time of the applied RF power.

One advantage is that the improvement in etch selectivity thus obtained is independent of the RF power level applied to the coil antenna. Therefore, this power level need not be limited, and may be selected to provide the highest plasma ion density and high etch rate while still obtaining the superior etch selectivity results.

The coil antenna of FIGS. 1 and 2 has a single conductor 205 and is therefore of a long length. It therefore does not resonate well at high frequencies and accordingly is suitable for lower frequency RF sources. In order to increase the resonant frequency of the coil antenna, a similar approach is provided in FIG. 4, but the antenna consists of three conductors of about a third the length of the conductor of FIGS. 1 and 2 for the same antenna diameter. Such an antenna will therefore resonate at about triple the resonant frequency of the antenna of FIGS. 1 and 2.

Figure 4:
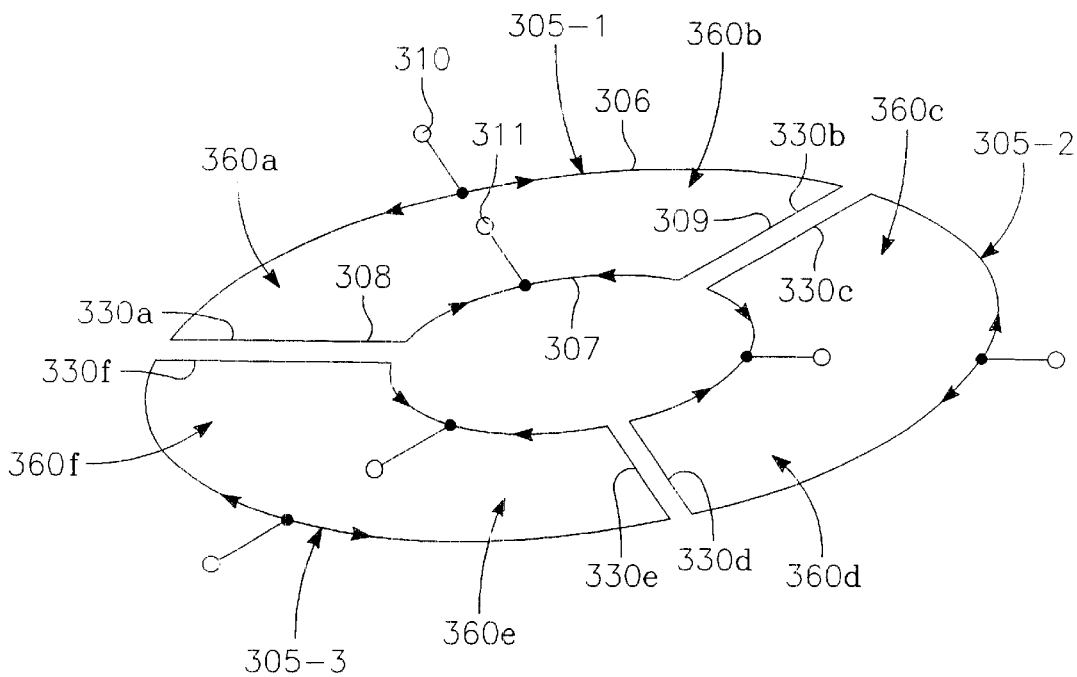
FIG. 4 is a perspective view of an antenna in accordance with a second embodiment.

The current flow pattern of the coil antenna of FIG. 4 is similar to that of FIG. 2 in that there are, in effect, six loops 360a–360f and six radial paths 330a–330f. However, the loops are grouped into three pairs, each pair of loops (e.g., the loop pair 360a, 360b) is formed by a separate conductor 305-1, the loop pair 360c, 360d being formed by the conductor 305-2 and the loop pair 360e, 360f being formed by the conductor 305-3. In the loop pair 360a, 360b (for example), the conductor 305-1 includes an outer arc section 306 and an inner arc section 307 joined end-to-end by radial end sections 308, 309. There is an input terminal 310 in the middle of the outer arc section 306. The radial path 330b begins at the middle of the outer arc section 306 and ends near the inner arc section 307 at the return terminal 311. This arrangement causes current to flow in opposite directions in the two halves of the outer section 306 and in the two halves of the inner section 307, as indicated by the arrows in the drawing of FIG. 4. During the instant in time depicted in FIG. 4, current flow from the input terminal 310 diverges into the two halves of the outer arc section 306 and converges from the two halves of the inner arc section 307 into the single conductor of the radial path 330b. The result is the formation of the two current loops 360a, 360b with current flowing in opposite directions. The magnetic fields of the two loops 360a, 360b are of opposite polarities. The foregoing features and characteristics obtain similarly in each of the other two loop pairs, namely 360c, 360d and 360e, 360f.

The main result is that the inductive antenna of FIG. 4 performs in a similar manner to that of the inductive antenna of FIG. 2 in that both embodiments have the same pair of distances D and d between adjacent opposing current loops and therefore tend to select electrons at energy bands centered at E(D) and E(d). The difference is that the inductive antenna of FIG. 4 is divided into three conductors 305-1, 305-1, 305-3, each being about a third of the length of the single conductor 205 of FIG. 2, so as to triple the antenna resonant frequency.

Figure 5:
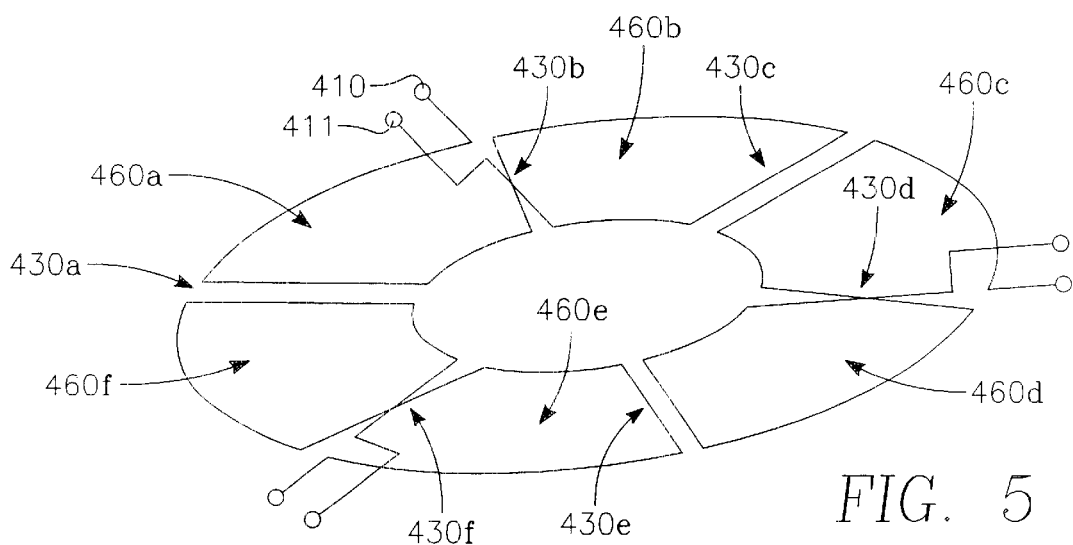
FIG. 5 is a top perspective view of an antenna in accordance with a third embodiment.

The embodiment of FIG. 5 provides a higher resonant frequency antenna like that of the FIG. 4 embodiment but with other characteristics more similar to that of the FIG. 2 embodiment. In the embodiment of FIG. 5, the loops are grouped into pairs of loops as in FIG. 4 (e.g, such as the loop pair 460a, 460b) but each pair of loops is wound in a "figure-eight" topography reminiscent of the embodiment of FIG. 1. As a result, each radial path 430a–f has two conductors, so that the amount of current is the same along each radial path 430a–f. Alternate ones of the radial paths 430a, 430c, 430e have conductors of adjacent loops, while the remaining radial paths 430b, 430d, 430f have two crossed-over conductors of the same loop forming the "figure-eight" topography.

The inductive antenna of FIG. 5 has a resonant frequency about half that of the embodiment of FIG. 4 because the distance current must travel in the embodiment of FIG. 5 between the input and output terminals 410, 411, respectively, is about twice the distance between the input and output terminals 310, 311 of the embodiment of FIG. 4. In FIG. 4 the current must travel only half-way around each of the arc sections to transit between the input and output terminals 310, 311 while in FIG. 5 the current must travel the circumference of both loops of each pair (e.g., the loop pair 460a, 460b) in order to transit between the input and output terminals 410, 411. Thus, the resonant frequency of the embodiment of FIG. 5 is about half that of the embodiment of FIG. 4, which in turn is three times that of the embodiment of FIG. 2.

Figure 6:
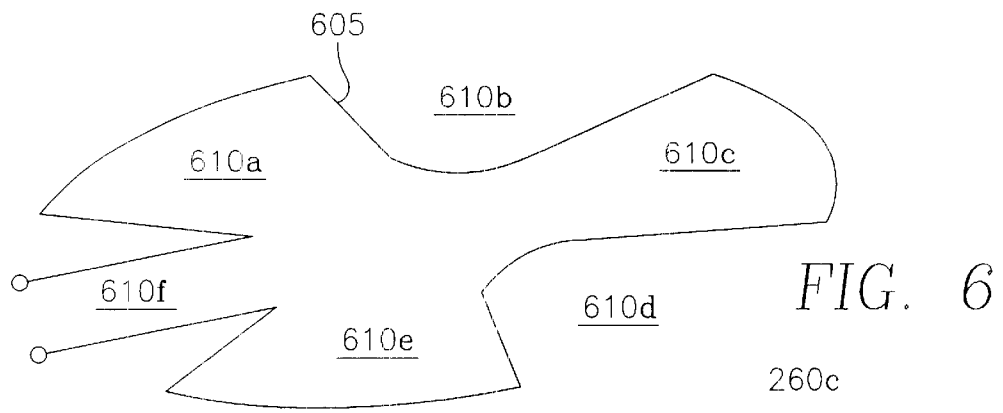
FIG. 6 is a top perspective view of an antenna in accordance with a third embodiment.

In the embodiment of FIG. 6, a series of adjacent zones 610a–610f of opposing polarity, a common feature of the foregoing embodiments, is constructed using a single conductor 605. The conductor 605 defines a number (e.g., three) equally spaced triangular loops 610a, 610c 610e, separated by three triangular sections 610b, 610d, 610f, each of the adjoining sections having a magnetic polarity opposite to that of the adjacent triangular loops. The conductor 605 of the embodiment of FIG. 6 is approximately half as long as the conductor 205 of FIG. 2, so that the embodiment of FIG. 6 has a resonant frequency of about twice that of the embodiment of FIG. 2.

Figure 7:
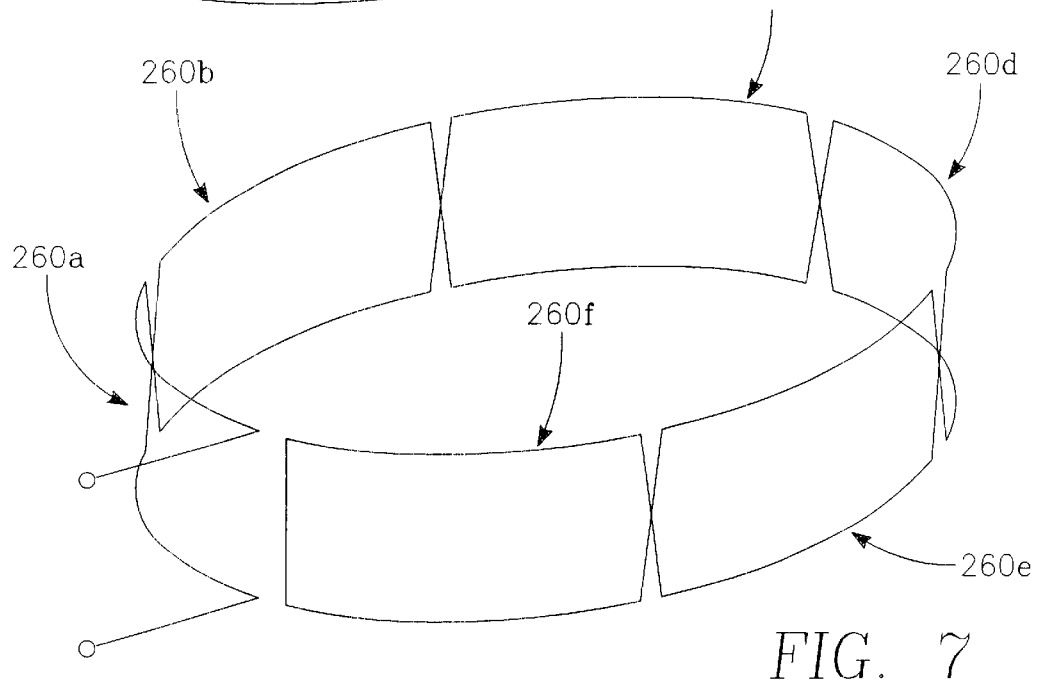
FIG. 7 is a perspective view of an antenna in accordance with a fourth embodiment.

FIG. 7 illustrates a modification of the embodiment of FIG. 2 in which the loops 260a–f have all been rotated so as to lie in a circular plane parallel to the axis of symmetry of the antenna. In other words, the loops 260a–f do not lie in a plane parallel to the reactor ceiling but are rather perpendicular to it and define a cylindrical surface.

Figure 8:
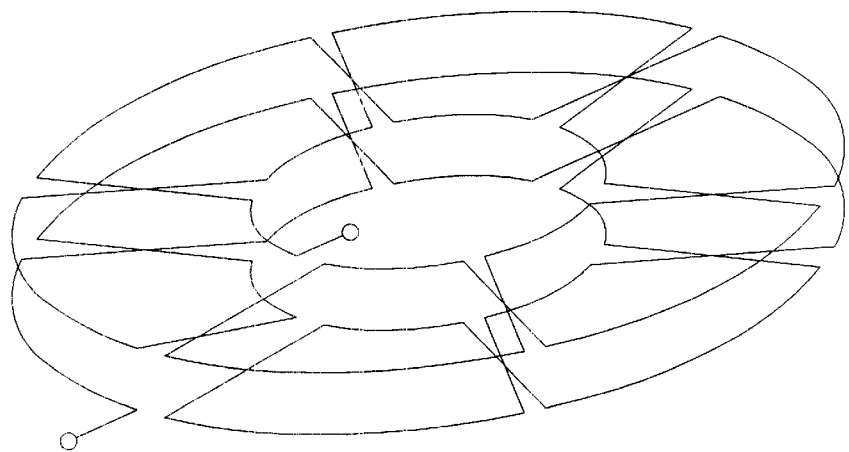
FIG. 8 is a perspective view of an antenna in accordance with a fifth embodiment.

FIG. 8 illustrates an embodiment in which two inductive antennas, each identical to the embodiment of FIG. 2, are stacked vertically along the axis of symmetry of the ceiling. The larger number of antenna elements in the embodiment of FIG. 8 improves efficiency.

Figure 9:
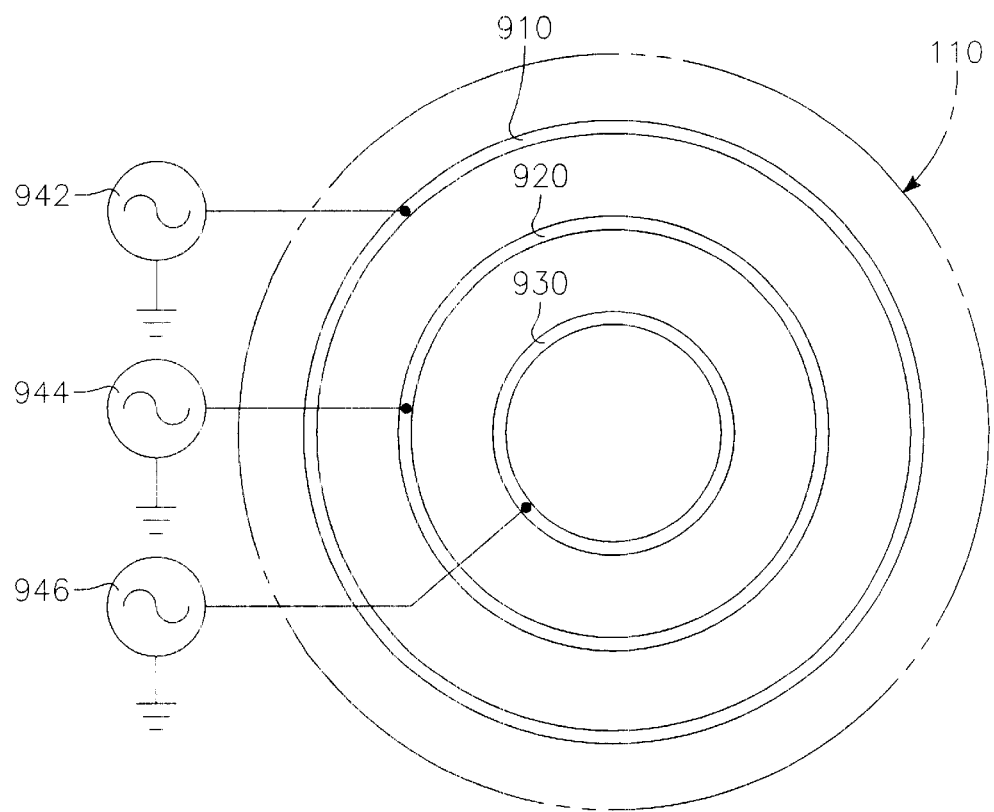
FIG. 9 is a simplified top view of an antenna in accordance wtih a sixth embodiment.

FIG. 9 illustrates how three multi-loop inductive antennas 910, 920, 930 of the type illustrated, for example, in FIG. 2, may have different diameters such that one can fit inside another one, so that the three antennas are nested within one another. Since together the three antennas cover a wide area, the embodiment of FIG. 9 is more suitable for processing large wafers in a large diameter reactor chamber. The three antennas 910, 920, 930 cover three separate radial zones of the chamber and can be powered by three separate RF power generators 942, 944, 946, as illustrated in FIG. 9. Adjustment of the radial distribution of plasma ion density can be achieved by adjusting the relative power levels of the three RF power generators 942, 944, 946. The three antennas 910, 920, 930 may be of the type of any one of the embodiments of FIGS. 1–8.

Figure 10:
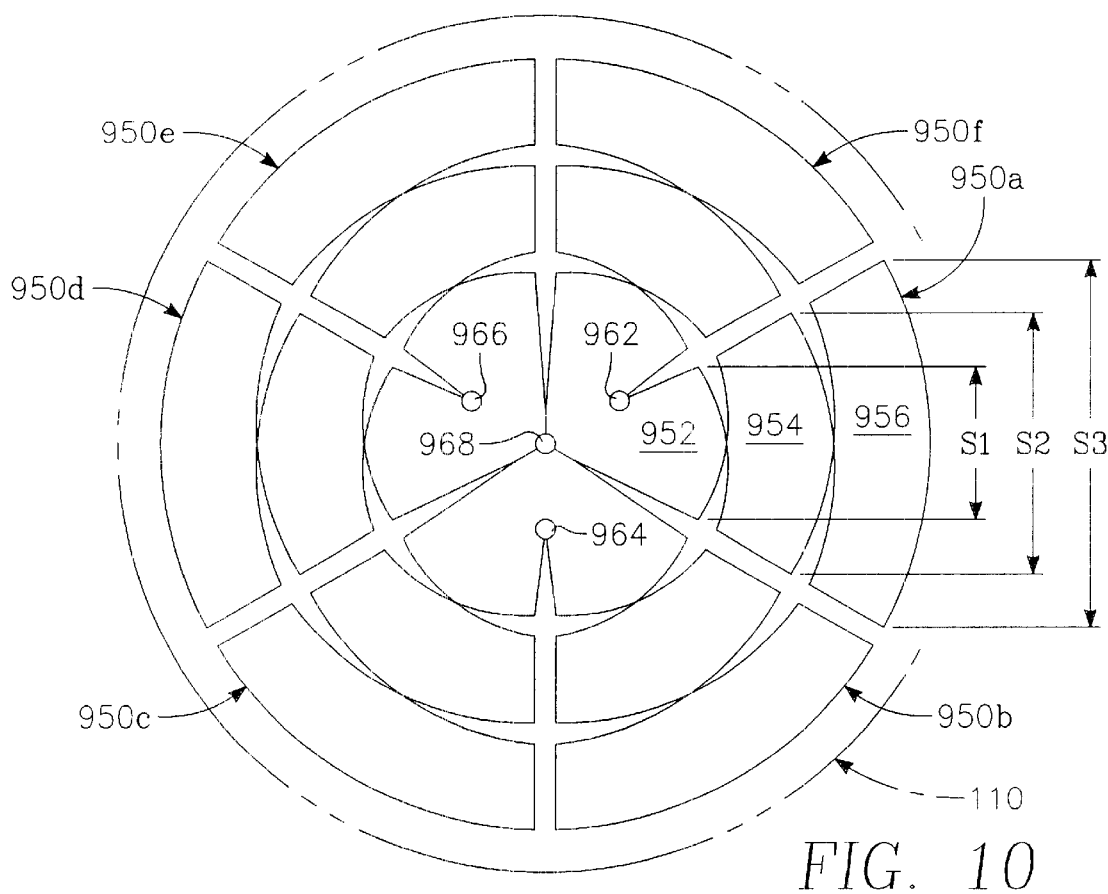
FIG. 10 is a top view of an antenna in accordance with a seventh embodiment.

FIG. 10 illustrates another way in which a circular array of multi-loop inductive antennas are distributed over a wide area plane. While the embodiment of FIG. 9 employed three antennas each residing within a respective annulus, the embodiment of FIG. 10 employs six antennas 950a–950f residing within six respective radially extending ("pie-shaped") zones. Each antenna 950a–f extends from the axis of symmetry out to the circular periphery of the array. The wiring topology of each of the six antennas 950a–950f is the same as the antenna of FIG. 2 except that the multiple loops do not reside in a circle but rather in a pie-shaped zone. Within an individual antenna 950a–f, there are three loops 952, 954, 956, the smallest one 952 being in the center and the largest 956 being at the periphery of the array. Adjacent ones of the three loops 952, 954, 956 are joined together in the manner of a "figure-eight" so that the shared conductors cross over. In this way, adjoining loops have opposing current directions and therefore opposing magnetic polarities.

Within the six inner-most loops 952, adjacent ones of the individual antennas 950a–950f share RF power input terminals 962, 964, 966. There is a single RF return terminal 968 at the center shared by all antennas 950a–950f.

One feature of the embodiment of FIG. 10 is that there are at least different lengths S1, S2, S3 along which electrons experience field reversal. Thus, there are at least three different electron energies, i.e., E(S1), E(S2), E(S3) that experience acceleration to higher energies. These energies are selected from a number of possible arrangements by the skilled worker in such a manner as to reduce the electrons remaining within the fluorine dissociation energy range.

Figure 11:
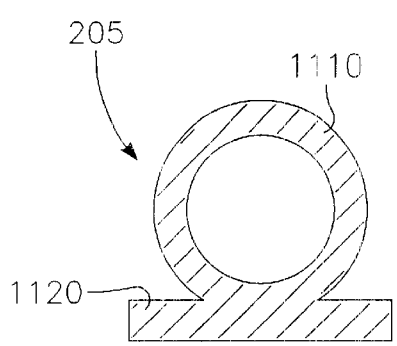
FIG. 11 is a cross-sectional view of a first embodiment of the conductor of the antenna of FIG. 2.
Figure 12:
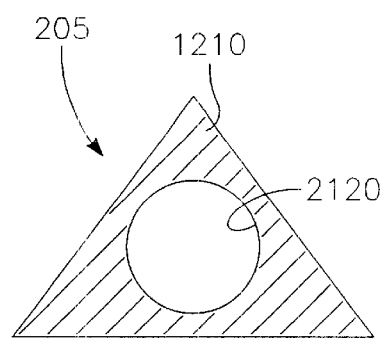
FIG. 12 is a cross-sectional view of a second embodiment of the conductor of the antenna of FIG. 2.
Figure 13:
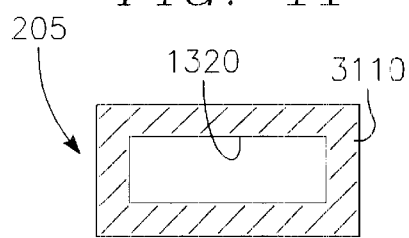
FIG. 13 is a cross-sectional view of a third embodiment of the conductor of the antenna of FIG. 2.
Figure 14:
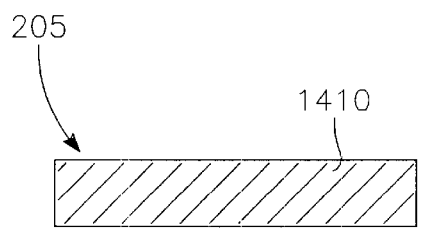
FIG. 14 is a cross-sectional view of a fourth embodiment of the conductor of the antenna of FIG. 2.

FIG. 11 is a cross-sectional view of a first embodiment of the conductor 205 which consists of an annular section 1110 formed with a flat section 1120 that is adjacent or rests on the ceiling 110. FIG. 12 is a cross-sectional view of a second embodiment of the conductor 205 having a triangular outer boundary 1210 and a cylindrical hollow interior 2120. FIG. 13 is a cross-sectional view of a third embodiment of the conductor 205 having a rectangular outer boundary 3110 and a rectangular hollow interior 1320. FIG. 14 is a cross-sectional view of a fourth embodiment of the conductor 205 which is a solid rectangular shape 1410.

One feature of the illustrated embodiments is the very close proximity of conductors of adjacent loops within the current paths shared by the loops, as referred to above in this specification. They are sufficiently close to provide an abrupt transition for an electron travelling across the boundary between loops of opposing current direction. As a result, if the RF cycle is at its zero-crossover at the instant the electron crosses this boundary, acceleration of the electron will continue virtually uninterrupted, which is the desired result. Therefore, the closer the conductors lying along the boundaries between adjacent loops, the better the electron continues to be accelerated before and after the RF zero-crossing. One example of the close proximity of such conductors is provided in the embodiments of FIGS. 1, 5 and 7–10 in which the conductors lying along the boundary between adjacent loops cross over one another. In the other embodiments, the conductors may not cross over, but they are sufficiently close to one another to appear, in effect, as a single current path. Thus, it is preferable to achieve the closest spacing possible of parallel conductors of adjoining loops. However, the invention is not limited to such embodiments, and may be implemented with slightly wider spacing (e.g., up to 3% of the distance across an individual loop).

While the invention has been described with reference to an array of side-by-side loops on a planar surface in which adjacent loops are oppositely wound, the surface need not necessarily be planar but could be a three-dimensionally shaped surface such as a dome-shape or multi-radius dome shape, for example.

While the invention has been described in detail by specific reference to preferred embodiments, it is understood that variations and modifications thereof may be made without departing from the true spirit and scope of the invention.

What is claimed is:

1. A plasma reactor for processing a semiconductor workpiece, said reactor comprising:
   a vacuum chamber with a sidewall and a ceiling enclosing said vacuum chamber;
   a workpiece support pedestal within said vacuum chamber;
   a process gas inlet to said vacuum chamber and a vacuum pump coupled to said vacuum chamber;
   an inductive antenna adjacent said vacuum chamber and an RF power source coupled to said inductive antenna, said inductive antenna comprising:
      an array of plural current conducting loops placed side-by-side and defining a surface, successive ones of said plural current conducting loops being wound so as to carry current from said F source in opposite directions,
      said current conducting loops comprising respective conductors, at least a portion of the conductor of one loop being adjacent at least a portion of the conductor of the next loop of said array, said portions carrying current in the same direction and defining a juncture sharing a common current path, said array having plural such junctures periodically spaced along at least one length thereof,
      said current conducting loops being arranged sequentially in an annulus of a non-zero inner radius and an outer radius, whereby said loops define a short spacing between successive ones of said junctures along said inner radius of said annulus and a long spacing between successive ones of said junctures along said outer radius of said annulus.

2. The reactor of claim 1 further comprising a gas source coupled to said process gas inlet and containing a process gas comprising a reactive species having a reactive species ionization energy band, and said long spacing and said short spacing correspond to a range of distances traveled during one cycle of said RE power source by electrons having a corresponding range of kinetic energies near said reactive species ionization energy band.

3. The reactor of claim 2 wherein said range of kinetic energies is below said reactive species ionization energy band.

4. The reactor of claim 2 wherein said range of kinetic energies is within said reactive species ionization energy band whereby electrons within said reactive species ionization energy band are excited to a higher energy level outside of said reactive species ionization energy band.

5. The reactor of claim 1 wherein said junctures are spaced uniformly.

6. The reactor of claim 1 wherein said array of successive loops comprises a single conductor wound in consecutive figure-eight loops which are squared and arranged in an annulus.

7. The reactor of claim 6 wherein said single conductor runs in two circular paths comprising an inner circular path, an outer circular path and plural radial paths, wherein respective halves of said single conductor run clockwise and counterclockwise, respectively, from a first connection terminal pair, with each one alternating between the inner and outer circular paths by passing through successive radial paths.

8. The reactor of claim 7 wherein, within alternate ones of the radial paths, the clock-wise extending half of the conductor extends inwardly while the counterclock-wise extending half runs outwardly, and in the remaining ones of the radial paths the clock-wise extending half of the conductor extends outwardly while the clock-wise extending half runs inwardly.

9. The reactor of claim 8 wherein current flow through portions of conductor halves lying within each radial path is in the same direction.

10. The reactor of claim 9 wherein portions of the conductor halves lying within the radial paths are sufficiently close to one another so that the currents of within each radial path appear to be a single current path.

11. The reactor of claim 1 wherein said surface defined by said array of loops is a planar surface.

12. The reactor of claim 1 wherein said surface is a right cylindrical surface coaxial with said vacuum chamber.

* * * * *